(12) United States Patent
Stowell et al.

(10) Patent No.: US 7,550,927 B2
(45) Date of Patent: Jun. 23, 2009

(54) SYSTEM AND METHOD FOR GENERATING IONS AND RADICALS

(75) Inventors: Michael W. Stowell, Loveland, CO (US); Guenter Klemm, Nidda (DE); Hans-Georg Lotz, Gründau-Rothenbergen (DE); Volker Hacker, Altenstadt (DE)

(73) Assignee: Applied Materials, Inc., Santa Clara, CA (US)

( * ) Notice: Subject to any disclaimer, the term of this patent is extended or adjusted under 35 U.S.C. 154(b) by 281 days.

(21) Appl. No.: 11/558,309

(22) Filed: Nov. 9, 2006

(65) Prior Publication Data
US 2008/0111490 A1    May 15, 2008

(51) Int. Cl.
*H05B 13/32* (2006.01)
(52) U.S. Cl. ............................... 315/111.81; 315/111.91
(58) Field of Classification Search ............ 315/111.21, 315/111.31, 111.41, 111.71, 111.81, 111.91
See application file for complete search history.

(56) References Cited

U.S. PATENT DOCUMENTS

| | | | |
|---|---|---|---|
| 6,610,959 B2* | 8/2003 | Carlson et al. | 219/76.15 |
| 6,670,766 B2* | 12/2003 | Yamazaki et al. | 315/111.21 |
| 6,872,909 B2* | 3/2005 | Holber et al. | 219/121.52 |
| 6,878,930 B1* | 4/2005 | Willoughby et al. | 250/281 |
| 7,074,370 B2* | 7/2006 | Segal et al. | 422/186.04 |
| 7,183,559 B2* | 2/2007 | Luten et al. | 250/423 R |
| 2003/0157000 A1* | 8/2003 | Janssen et al. | 422/139 |

* cited by examiner

*Primary Examiner*—Douglas W Owens
*Assistant Examiner*—Minh Dieu A
(74) *Attorney, Agent, or Firm*—Cooley Godward Kronish, LLP

(57) ABSTRACT

A system and method for producing electrons and ions are disclosed. One embodiment includes an outer electrode with a discharge chamber; an inner electrode positioned inside the discharge chamber, the inner electrode positioning forming a upper portion of the discharge chamber and a lower portion of the discharge chamber; and a gas inlet positioned in the lower portion of the discharge chamber; wherein a plasma formed within the lower portion of the discharge chamber provides priming particles usable to form a plasma in the upper portion of the discharge chamber.

13 Claims, 10 Drawing Sheets

SYSTEM AND METHOD FOR GENERATING IONS AND RADICALS

FIELD OF THE INVENTION

The present invention relates to systems and methods for generating ions and radicals, including lower energy ions and radicals. In particular, but not by way of limitation, the present invention relates to systems and methods for generating ions and radicals usable in surface preparation, film deposition, charge removal, cleaning, and other processes.

BACKGROUND OF THE INVENTION

Ions sources are commonly used in several industries. For example, ion sources are often used to pretreat surfaces, such as polymer substrates, in preparation for deposition of thin films. Ion sources are also used to change the chemistry of thin films during plasma deposition process. Additionally, ion sources can be used to remove charge buildup from films or to clean surfaces.

Ion sources are available from a variety of vendors and are known in the art. But these ion sources typically suffer from several drawbacks. One drawback is that linear ion sources are overly expensive and complicated for many uses. In fact, many applications that would benefit from ion sources forego their use because of the high costs. Another drawback is that current ion sources tend to produce ions with too much energy. Some ion sources produce ions with over 120 eV of energy. In many applications, ions with this much energy can damage the surface being treated or damage the film being deposited.

Although present ion sources are functional, they do not fulfill all requirements demanded of ion sources. Accordingly, a system and method are needed to address the shortfalls of the present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide a system and method for producing ions. One embodiment includes an outer electrode with a discharge chamber; an inner electrode positioned inside the discharge chamber, the inner electrode positioning forming a upper portion of the discharge chamber and a lower portion of the discharge chamber; and a gas inlet positioned in the lower portion of the discharge chamber; wherein a plasma formed within the lower portion of the discharge chamber provides priming particles usable to form a plasma in the upper portion of the discharge chamber.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
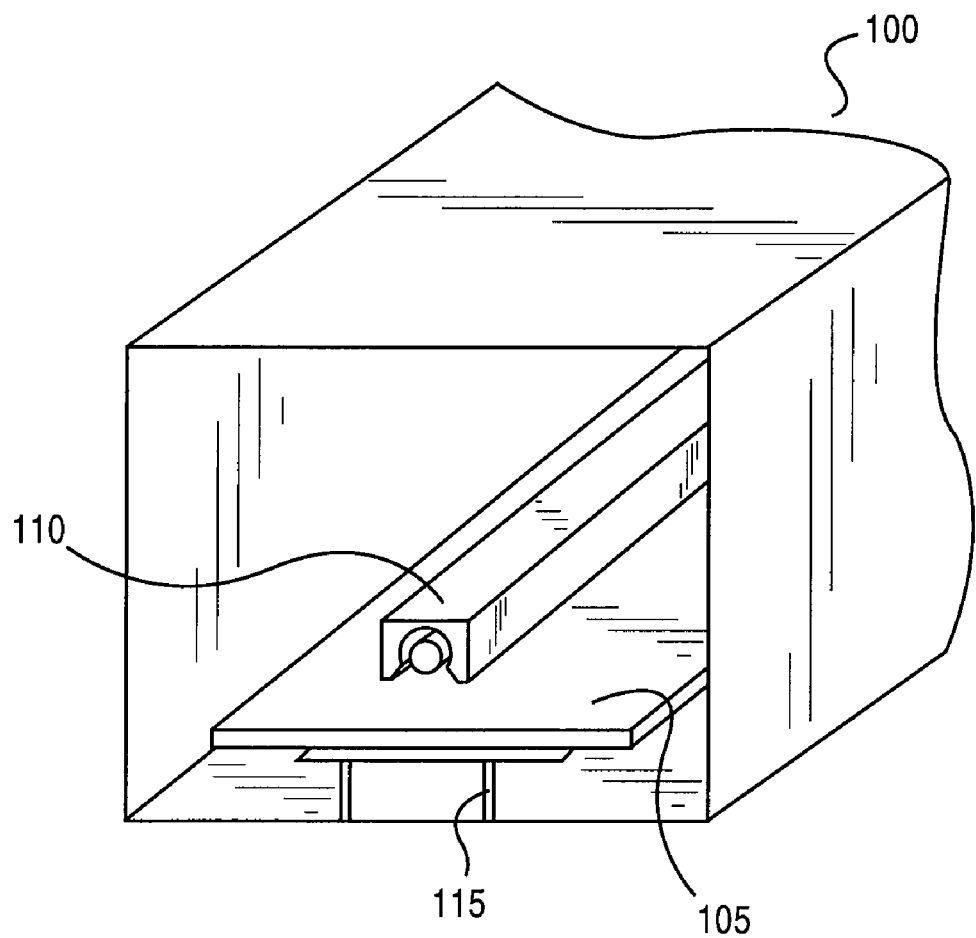
FIG. 1 illustrates a process chamber for pretreating a surface in accordance with one embodiment of the present invention.

Referring now to the drawings, where like or similar elements are designated with identical reference numerals throughout the several views, and referring in particular to FIG. 1, it illustrates a process chamber 100 for pretreating a substrate 105. This embodiment includes a process chamber 100, a linear ion source 110, a substrate support 115, and a substrate 105. Several other components, such as the power supply and the gas inlet, are not illustrated. But those of skill in the art will recognize how these components interact with the novel components shown.

In operation, a supporting gas is introduced into the ion source 110 or near the ion source 110. This ion source 110 is connected to a power supply. Typically, the power supply is an AC, RF, or microwave power supply. The power applied to the ion source 110 creates a plasma in and around the ion source 110. This plasma contains partially ionized gas that consists of large concentrations of excited atomic, molecular, ionic, and free radical species. These particles impact the substrate 105, and depending upon the process employed, clean the substrate, roughen in, or remove excess electrical charge.

Excitation of the supporting gas is accomplished typically by subjecting the gas, which is enclosed in the process chamber to an electric field generated by the power supply. Free electrons gain energy from the imposed electric field and collide with neutral gas atoms, thereby ionizing those atoms and fractionalizing the supporting gas to form numerous reactive species. It is the interaction of these excited species with solid surfaces placed in or near the plasma that results in the chemical and physical modification of the material surface.

The effect of plasma on a given material is determined by the chemistry of the reactions between the surface and the reactive species present in the plasma. At low exposure energies, the plasma surface interactions clean or change the surface of the material. The effects are confined to a region only several molecular layers deep and do not change the bulk properties of the substrate. The resulting surface changes depend on the composition of the surface, gas used, energy, and energy densities. Gases, or mixtures of gases, used for plasma treatment of polymers can include air, nitrogen, argon, oxygen, nitrous oxide, helium, water vapor, carbon dioxide, methane, or ammonia. Each gas produces a unique plasma composition and results in different surface properties. For example, the surface energy can be increased very quickly and effectively by plasma-induced oxidation, nitration or hydrolyzation.

Depending on the chemistry of the polymer and the source gases, substitution of molecular moieties into the surface can make polymers either wettable or totally non-wettable. The specific type of substituted atoms or groups determines the specific surface potential. For any gas composition, three competing surface processes simultaneously alter the surface, with the extent of each depending on the chemistry and process variables: ablation, cross linking, and activation.

Ablation is similar to an evaporation process. In this process, the bombardment of the polymer surface by energetic particles and radiation breaks the covalent bonds of the polymer backbone, resulting in lower-molecular-weight polymer chains. As long molecular components become shorter, the volatile oligomer and monomer byproducts boil off (ablate) and are swept away with the vacuum-pump exhaust.

Cross-linking is done with an inert process gas (argon or helium). The bond breaking occurs on the polymer surface, but since there are no free-radical scavengers, it can form a bond with a nearby free radical on a different chain (crosslink).

Activation is a process where surface polymer functional groups are replaced with different atoms or chemical groups from the plasma. As with ablation, surface exposure to energetic species abstracts hydrogen or breaks the backbone of the polymer, creating free radicals. In addition, plasma contains very high-energy UV radiation. This UV energy creates additional similar free radicals on the polymer surface. Free radicals, which are thermodynamically unstable, quickly react with the polymer backbone itself or with other free-radical species present at the surface to form stable covalently bonded atoms or more complex groups. Plasma pretreatment of a substrate can increase the wettability of a substrates surface improving adhesion of the growing film to the substrate.

Figure 2:
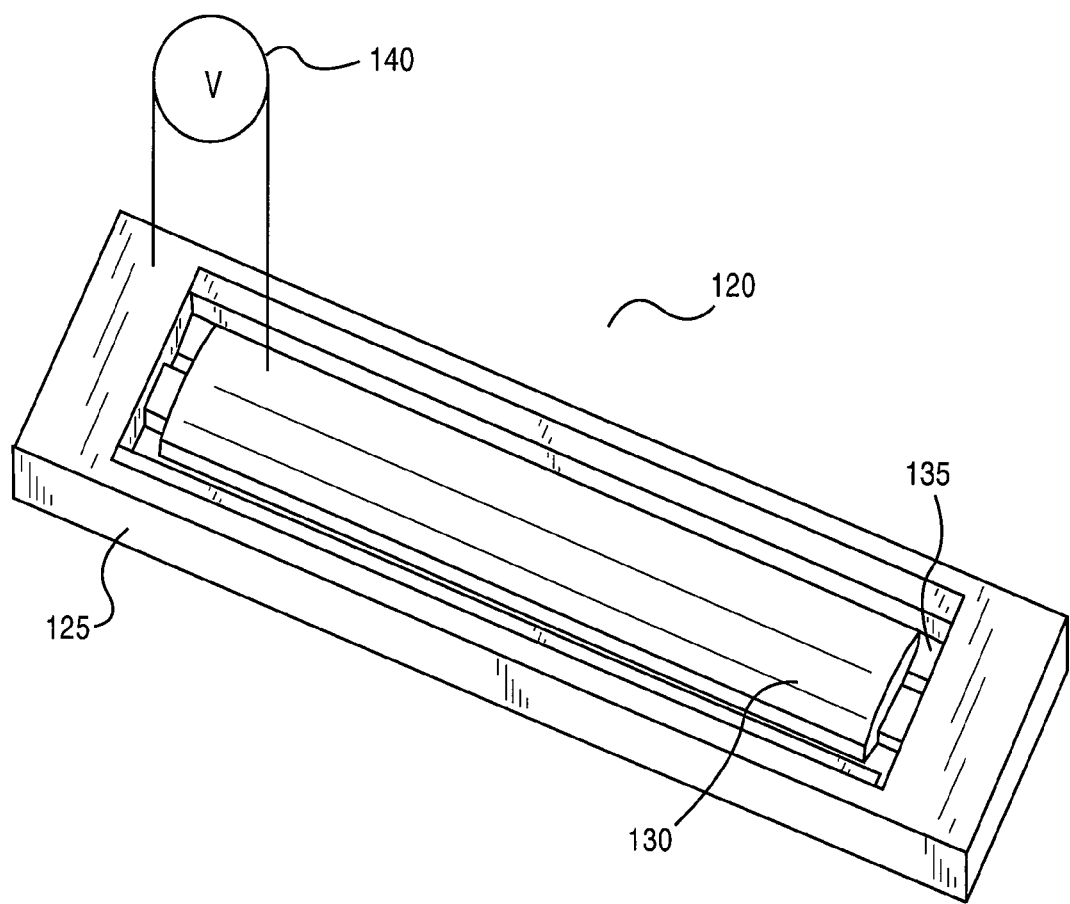
FIG. 2 illustrates an ion source in accordance with one embodiment of the present invention.

Referring now to FIG. 2, it illustrates a top view of a ion source 120 in accordance with the present invention. This ion source 120 could be used for surface treatment as shown in FIG. 1, or it could be used for other purposes—including film chemistry modification and charge removal. This ion source 120 includes an electrode 125, an electrode 130, and a discharge chamber 135, and a power source 140. This ion source 120 generates a high-density plasma in the discharge chamber 135, thereby generating ions and radicals. The electrode 125 and the electrode 130 are sometimes referred to as an outer electrode and an inner electrode. The charge on these two electrodes can be switched in certain embodiments.

This ion source 120 can operate at pressures below 2 millitorr and up to 100's of millitorr, due in part to the existence of a plasma discharge volume at the bottom inside portion of the discharge chamber 135. (The different portions of the chamber are illustrated in more detail by FIG. 4.) This portion of the plasma provides priming particles for the upper portion of the discharge chamber 135. Using these priming particles, a plasma is formed at the upper portion of the discharge chamber 135, where increased electric fields exist. This plasma is focused into a tight location, thereby increasing local plasma density.

This type of linear ion source 120 could be used to follow a curved substrate in the axis of curvature for uniform surface treatment, with lengths up to 2-3 meters or more possible. It can be used for static and dynamic coating systems and cleaning. Additionally, this source can be configured to provide ions with less than 5 eV of energy, and it can be calibrated by varying the power delivered to the electrode and any bias to provide ions with significantly more energy.

Figure 3:
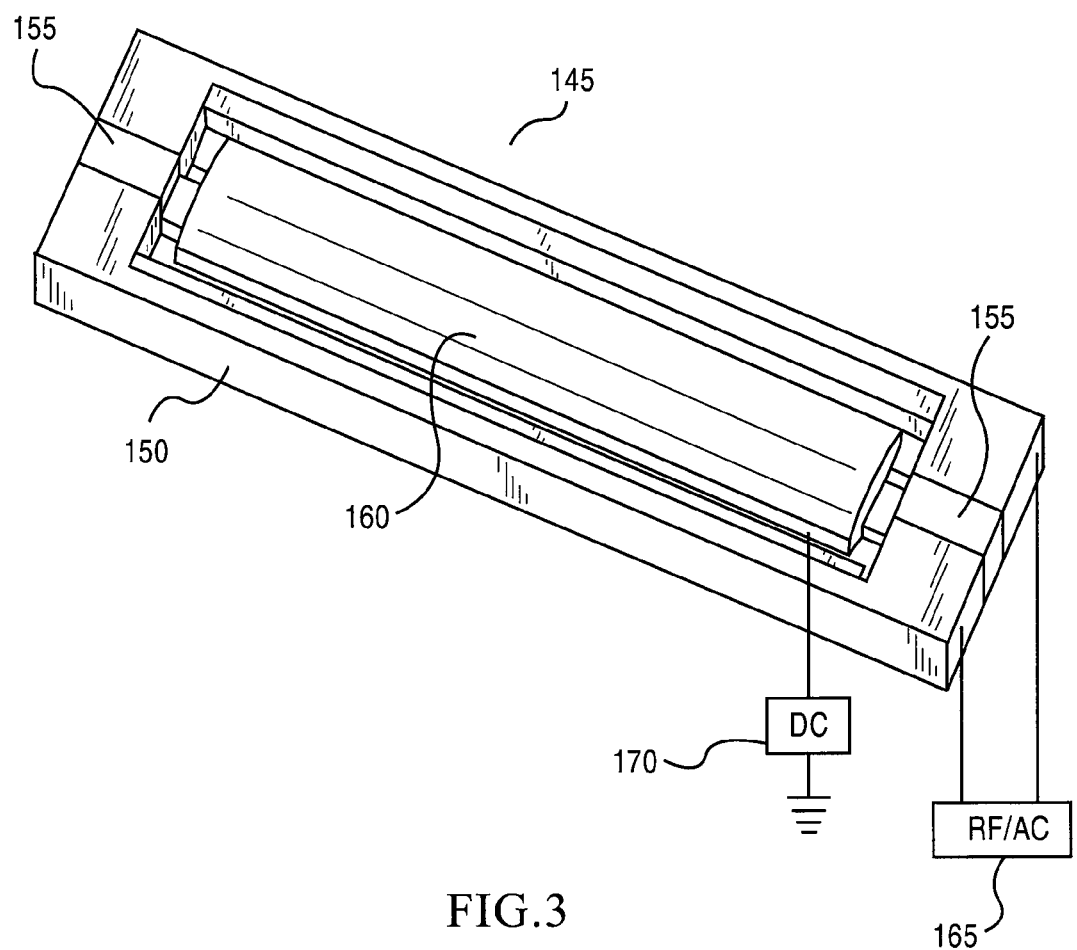
FIG. 3 illustrates an ion source in accordance with another embodiment of the present invention.

Referring now to FIG. 3, it illustrates an alternate embodiment of an ion source 145 in accordance with the present invention. In this ion source 145, the electrode 150 is divided by an insulator 155 into two electrically separated portions. To create the necessary plasma, the cathode 160 is electrically biased 170, and the primary power 165 is applied to the electrodes 150. The electrode portions, for example, can be connected to an AC power supply, RF power supply, or a microwave power supply.

This embodiment could be used in the removal of negative charge buildup from the surface of a web substrate after coating has been completed. In such an embodiment, the center electrode could be made of a carbon fiber material, which tends to homogenize the discharge at high frequencies to reduce the effects of localized mechanical tolerances and has a lower sputter yield to the plasma.

Figure 4:
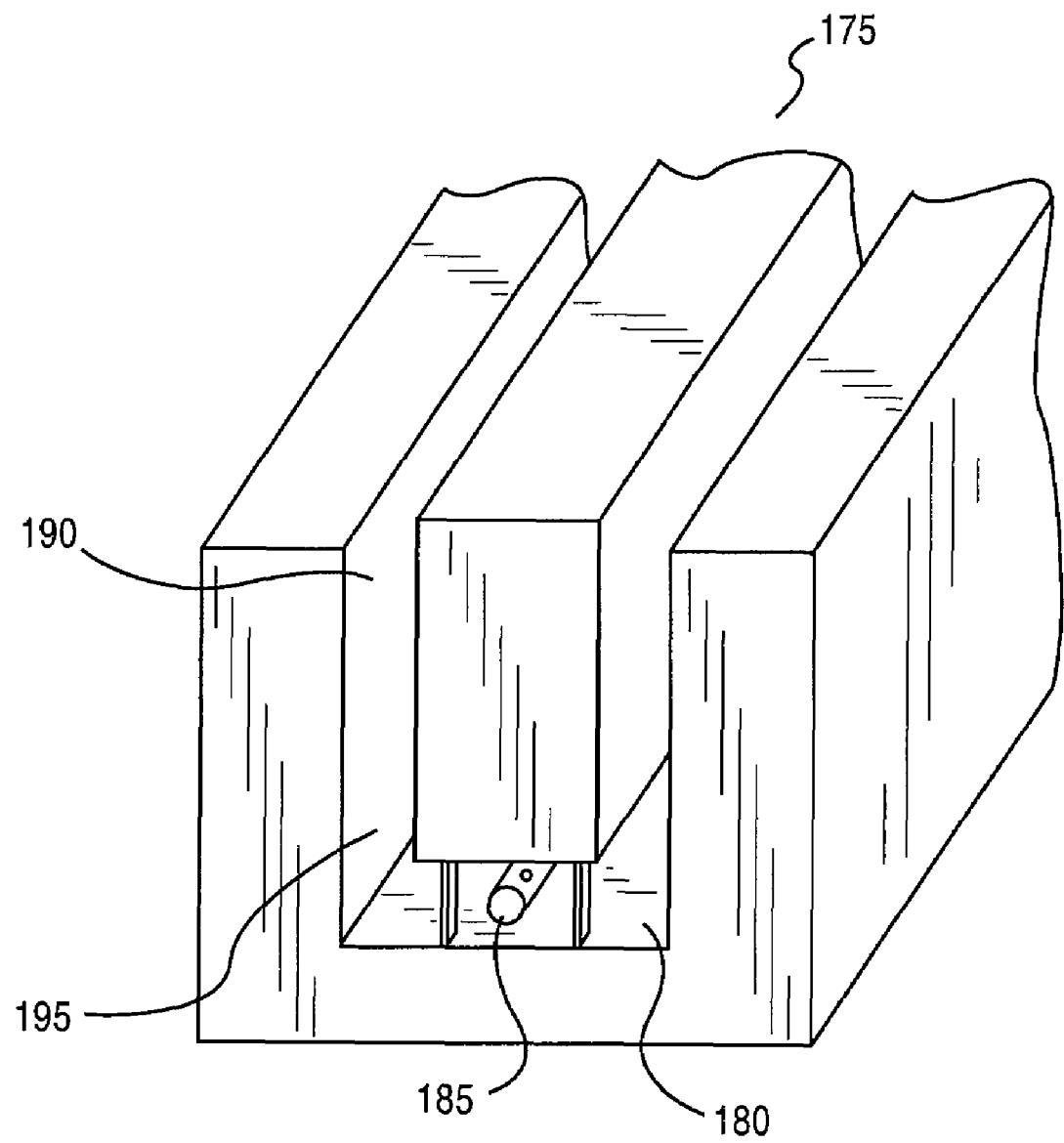
FIG. 4 illustrates a cross section of an ion source in accordance with one embodiment of the present invention.

Referring now to FIG. 4, it illustrates a cross section of an ion source 175 constructed in accordance with one embodiment of the present invention. This illustration better illustrates the lower discharge chamber 180. Additionally, this illustration shows the gas inlet 185 at the bottom of the ion source.

Typically, the gas inlet 185 runs the length or substantially the length of the ion source 175 and introduces gas in a near uniform distribution within the bottom of the discharge chamber 180. The gas flow into this bottom area is at its greatest amount and results in the highest pressure—that coupled with the high electric field will promote low breakdown voltages and will maintain a low density discharge once this breakdown has occurred.

The discharge chamber 180 includes a bottom portion 195 and an upper portion 190. Due to the introduction of the gas in the bottom portion 195 of the discharge chamber 180, the plasma initially forms in this portion of the discharge chamber 180. This plasma generates priming particles that help ignite a plasma in the upper portion 190 of the discharge chamber 180. The plasma in the upper portion provides the ions used for surface treatment, film chemistry alteration, and other processes.

Figure 5:
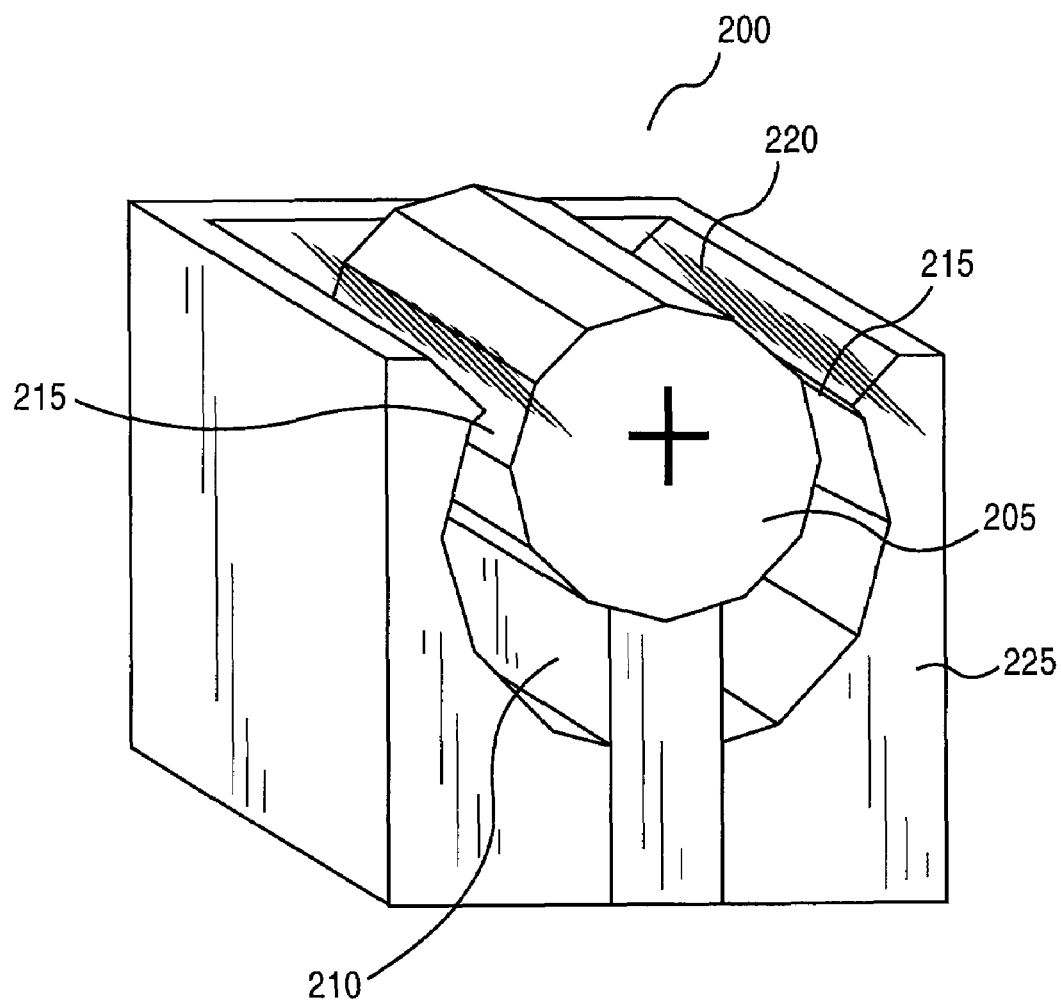
FIG. 5 illustrates a cross section of an ion source in accordance with another embodiment of the present invention.

Referring now to FIG. 5, it illustrates another embodiment of an ion source 200. This embodiment is similar to the other embodiments except for shape. In this embodiment, the electrode 205 is octagonal, and the discharge chamber 210 is similarly shaped. Other embodiments include a circular electrode, a square anode, a triangular anode, an oval anode, etc. The discharge chamber can match the shape of the anode or could be an irregular shape. The irregular shape of the discharge chamber can be used to increase volume of certain portions of the discharge chamber.

In this embodiment, the anode is offset within the discharge chamber 210. That is, the anode is not centered within the discharge chamber 210. Instead, the anode 205 is placed such that the bottom portion of the discharge chamber 210 includes more volume than does the upper portion of the discharge chamber 210. Notice that the anode 205 creates pinch points 215 in the upper portion of the discharge chamber 210. These pinch points 215 help retain gas in the bottom portion of the discharge chamber 210, thereby increasing gas pressure in the bottom portion of the discharge chamber 210.

The lips 220 of the electrode 225 can also be contoured or tapered to shape the pinch point. In FIG. 5, the electrode 225 is shaped so as to produce a narrow pinch point 215. The area above the pinch point 215 opens up to enable the plasma more volume in which to expand. The pinch points also serve to increase electric field strength.

Figure 6:
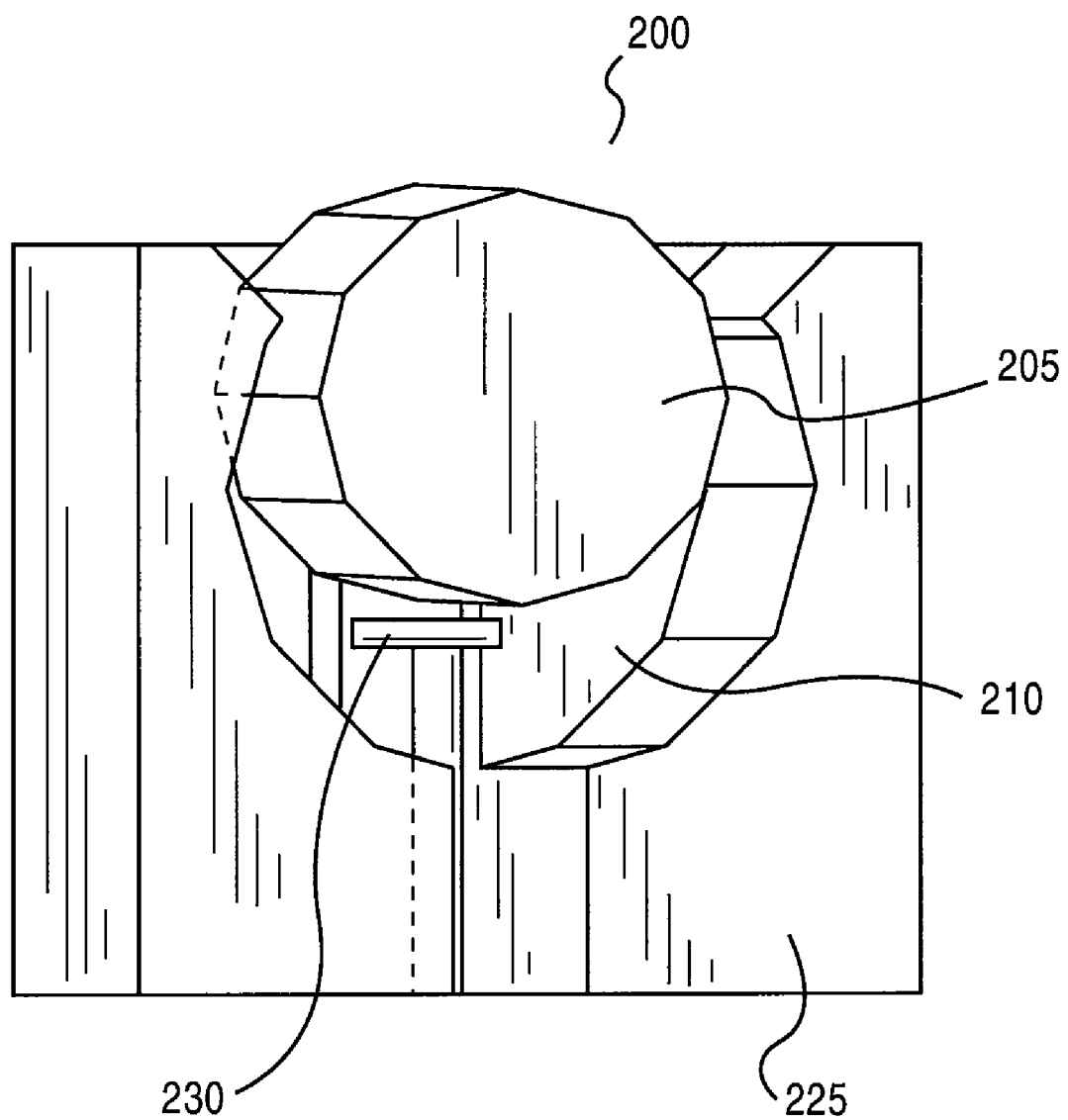
FIG. 6 illustrates a cut-away cross section of an ion source in accordance with one embodiment of the present invention.

FIG. 6 illustrates a different view of the ion source 200 shown in FIG. 5. This cut-away view shows the gas inlet 230 located between the anode 205 and the bottom portion 225 of the electrode.

Figure 7:
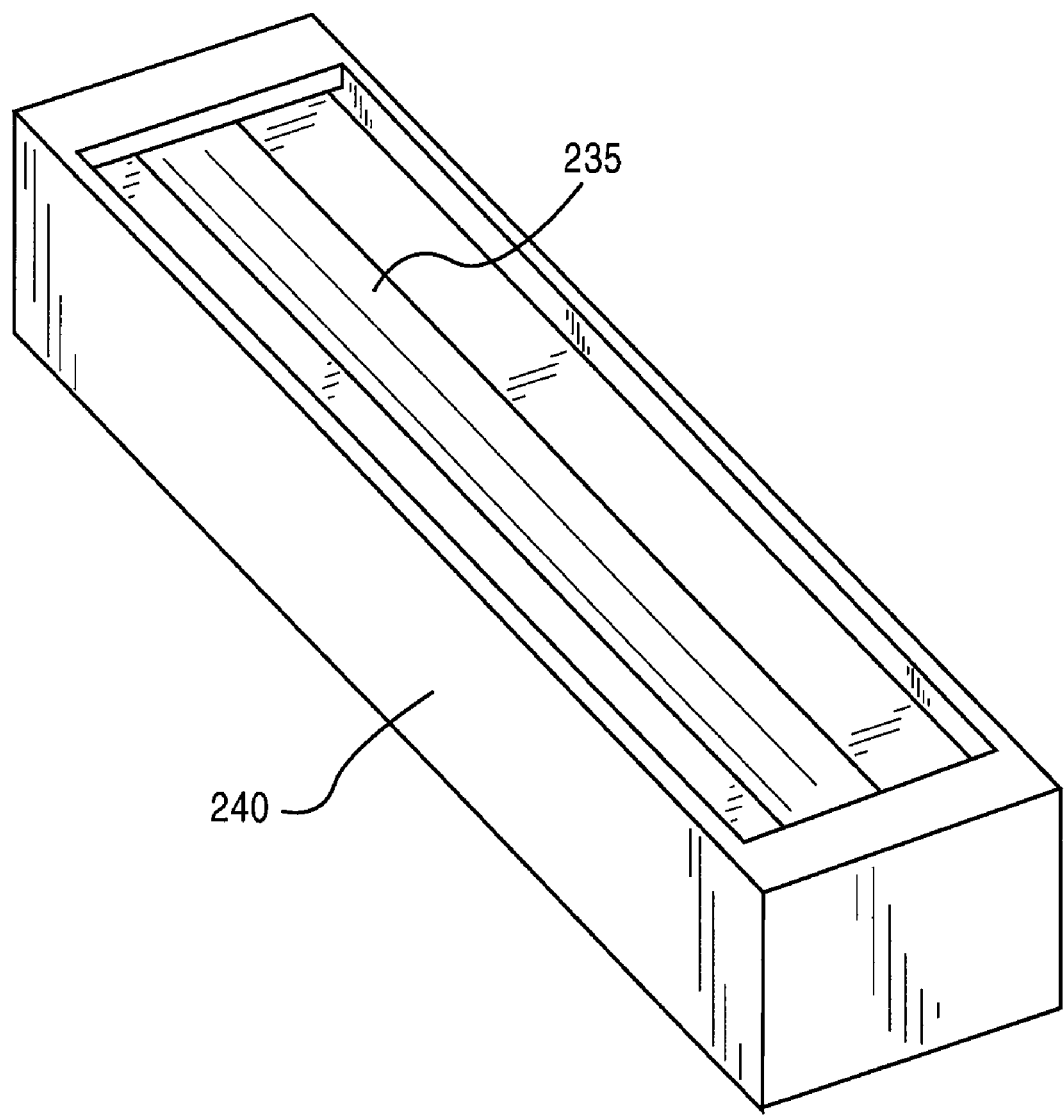
FIG. 7 illustrates an ion source and a gas shroud in accordance with the present invention.
Figure 8:
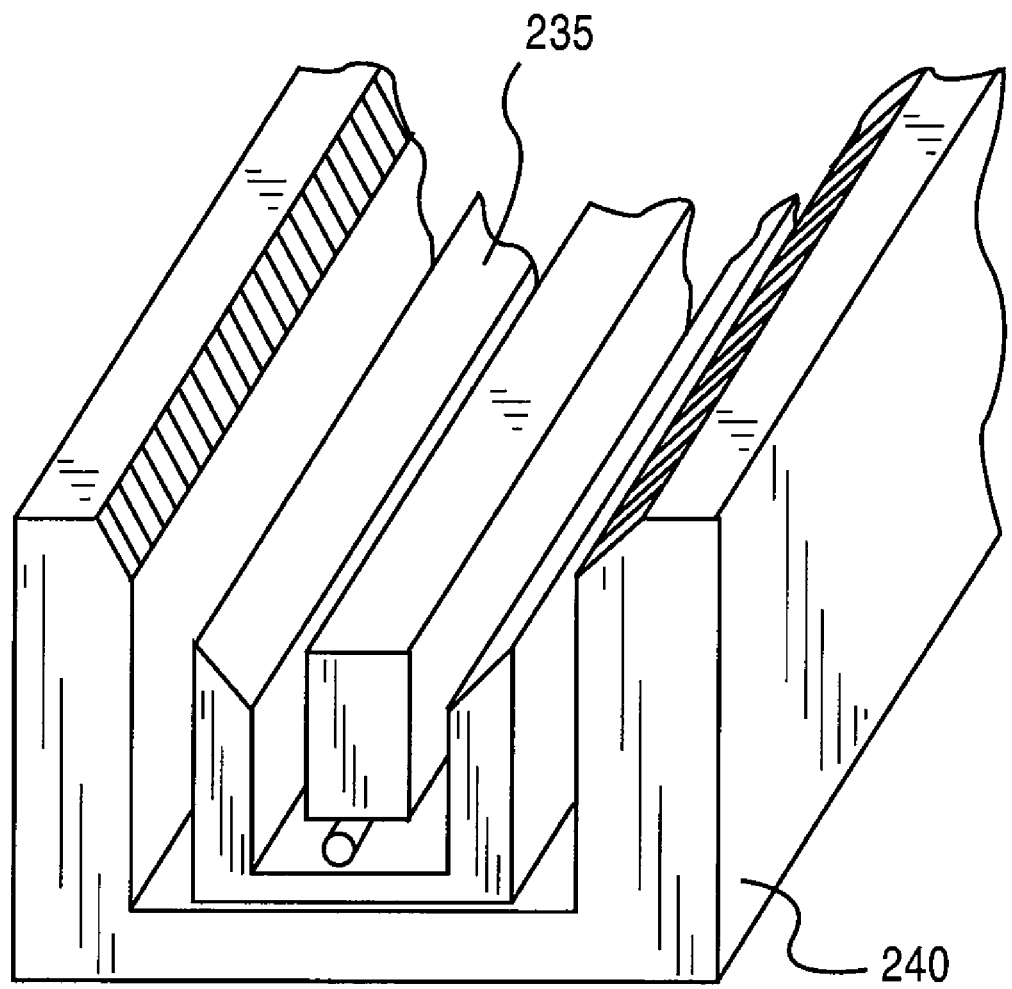
FIG. 8 illustrates a cross section of an ion source and a gas shroud in accordance with one embodiment of the present invention.

Referring now to FIGS. 7 and 8, they illustrate an ion source 235 located within a gas shroud 240. The ion source can be of any type described herein.

Figure 9:
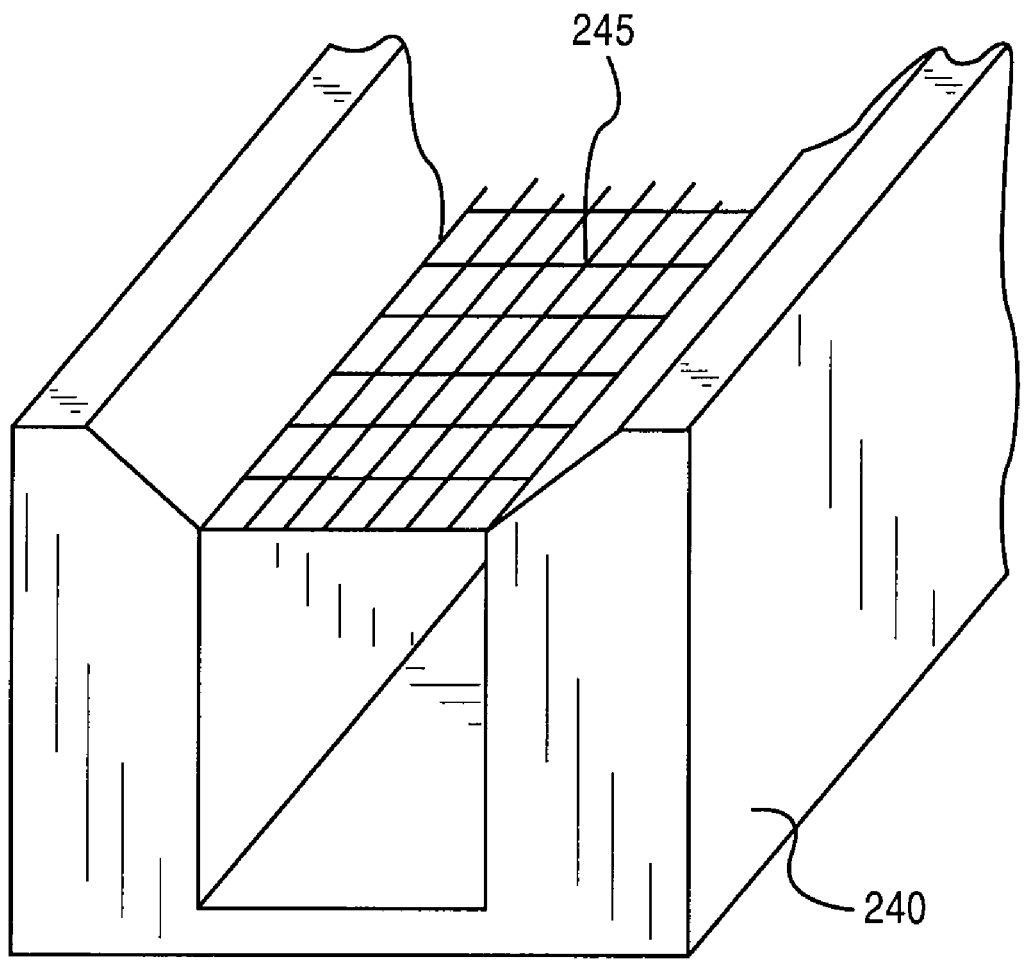
FIG. 9 illustrates a cross section of a gas shroud with a grid in accordance with the present invention.

Referring now to FIG. 9, it illustrates a gas shroud 240 with a mesh 245 used to energize and extract ions from the plasma generated by the ion source. The mesh 245 also helps control the direction of any ions extracted from the ion source. For visual clarity, the actual ion source is not included in this illustration.

In this embodiment, no source turnarounds are necessary in the gas shroud 240. This configuration allows the use of a single or multiple slot discharge since the ends are not magnetically closed, the ends are merely capped to maintain a partial pressure differential in the various plasma discharge zones in the source for proper operation.

Figure 10A:
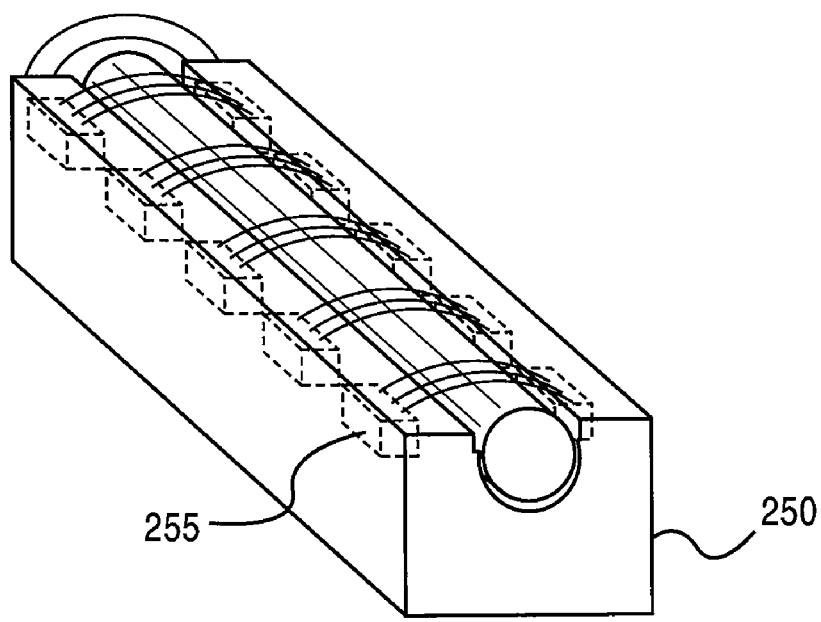
FIGS. 10A and 10B illustrate ion sources enhanced with magnets in accordance with one embodiment of the present invention.
Figure 10B:
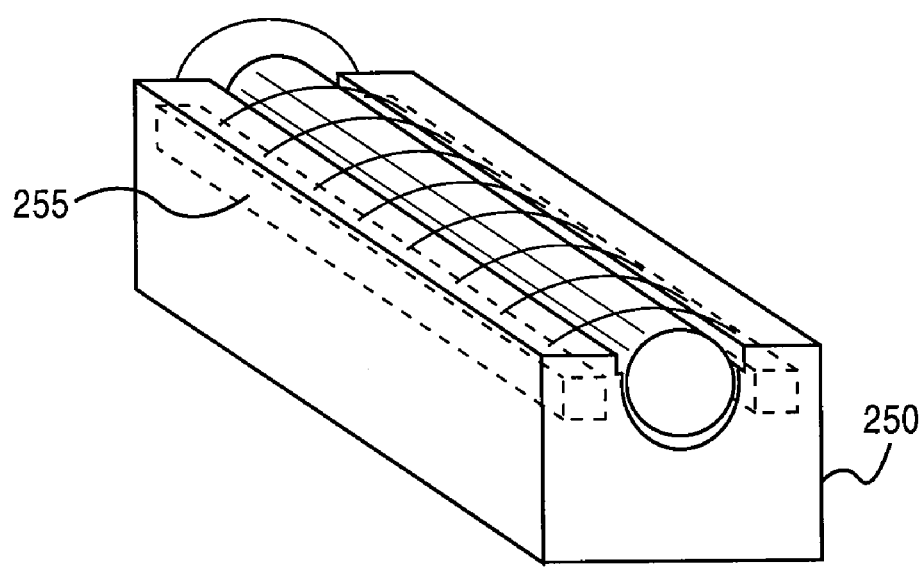

Referring now to FIGS. 10A and 10B, they illustrate ion sources 250 enhanced by magnets 255. Magnets help increase the mean free path of electrons traveling from the anode to the cathode. By increasing the mean free path, the electrons have a higher chance of ionizing and fractionalizing the supporting gas introduced into the ion source. FIG. 10A illustrates an embodiment with periodically-spaced magnets, and FIG. 10B illustrates and embodiment with a near-full length magnet.

In conclusion, the present invention provides, among other things, a system and method for generating ions that can be used in dynamic and static processes to achieve results in surface modification of polymer substrates, ion assisted deposition in low formation energy kinetically limited film growth applications, plasma cleaning of substrates and can be used for charge build up removal from the surface of charged substrates and web coatings. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A system for producing ions, the system comprising:
   an outer electrode with a discharge chamber;
   an inner electrode positioned inside the discharge chamber, the inner electrode positioning forming a upper portion of the discharge chamber and a lower portion of the discharge chamber; and
   a gas inlet positioned in the lower portion of the discharge chamber;
   wherein a plasma formed within the lower portion of the discharge chamber provides priming particles usable to form a plasma in the upper portion of the discharge chamber.

2. The system of claim 1, wherein the inner electrode is offset within the discharge chamber to thereby increase the volume of the lower portion of the discharge chamber.

3. The system of claim 1, wherein the inner electrode is cylindrical.

4. The system of claim 3, wherein the discharge chamber is cylindrical.

5. The system of claim 3, wherein the discharge chamber is irregularly shaped.

6. The system of claim 1, wherein the inner electrode has a polygonal cross section.

7. The system of claim 1, wherein the outer electrode includes a tapered lip.

8. The system of claim 7, wherein the tapered lip creates a pinch point between the tapered lip and the inner electrode.

9. The system of claim 1, wherein the outer electrode comprises a first portion and a second portion and wherein the first portion and the second portion are electrically isolated.

10. The system of claim 9, further comprising an insulator separating the first portion of the outer electrode from the second portion of the outer electrode.

11. The system of claim 1, further comprising a gas shroud, wherein the outer electrode is placed within the gas shroud.

12. The system of claim 11, wherein the gas shroud includes an open portion, the system further comprising:
    a filament positioned across the open portion of the gas shroud.

13. The system of claim 1, wherein the outer electrode forms the discharge chamber.

* * * * *